(12) United States Patent
Spallek et al.

(10) Patent No.: US 6,537,626 B1
(45) Date of Patent: Mar. 25, 2003

(54) CVD-COATED GLASS CONTAINER

(75) Inventors: Michael Spallek, Ingelheim (DE);
Marten Walther, Engelstadt (DE);
Manfred Lohmeyer, Nackenheim
(DE); Martin Heming, Stromberg (DE)

(73) Assignee: Schott Glaswerke (DE)

( * ) Notice: Subject to any disclaimer, the term of this patent is extended or adjusted under 35 U.S.C. 154(b) by 0 days.

(21) Appl. No.: 08/867,395

(22) Filed: Jun. 2, 1997

(30) Foreign Application Priority Data

Jun. 5, 1996 (DE) ......................................... 196 22 550

(51) Int. Cl.⁷ .......................... B05D 5/00; C23C 16/40; C23C 16/513
(52) U.S. Cl. ...................... 428/34.4; 65/60.5; 65/60.53; 428/426; 428/428; 428/446; 428/698
(58) Field of Search ................................. 428/426, 428, 428/446, 698; 65/60.5, 60.53; 427/255

(56) References Cited

U.S. PATENT DOCUMENTS

| | | | |
|---|---|---|---|
| 3,182,839 A | 5/1965 | Hoag | 215/1 |
| 3,833,406 A | 9/1974 | White | 117/97 |
| 4,485,146 A * | 11/1984 | Mizuhashi et al. | 428/428 |
| 5,017,404 A * | 5/1991 | Paquet et al. | 427/45.1 |
| 5,030,475 A * | 7/1991 | Askermann et al. | 427/39 |
| 5,236,511 A * | 8/1993 | Etzkorn et al. | 118/723 |
| 5,431,707 A * | 7/1995 | Recourt et al. | 65/60.5 |
| 5,531,060 A * | 7/1996 | Fayet et al. | 53/426 |
| 5,578,103 A * | 11/1996 | Araujo et al. | 65/60.5 |

FOREIGN PATENT DOCUMENTS

| | | | |
|---|---|---|---|
| DE | 3801 111 A 1 | 7/1989 | ......... C03C/17/245 |
| DE | 43 27 513 A 1 | 3/1994 | ......... C03C/17/245 |
| DE | 195 02 103 | 8/1995 | ........... B29C/49/24 |
| EP | 0 446 596 | 9/1991 | ........... C23C/16/50 |
| EP | 0 665 304 | 8/1995 | ........... C23C/14/22 |
| FR | 2 697 014 | 4/1994 | ......... C03C/17/245 |

OTHER PUBLICATIONS

German Office Action Mar. 12, 1997 (English Translation).
European Search Report Oct. 27, 1997 (German, Not Translated).
Patent Abstracts of Japan vol. 014, No. 446 (C–0763), Sep. 25, 1990 & JP 02 175630 A (Matsumoto Seiyaku Kogyo KK et al), Jul. 6, 1990, Zusammenfassung.
Borchert S.J. et al: "Accelerated Extractable Studies of Borosilicate Glass Containers" Journal of Parenteral Science and Technology, Bd. 43, Nr. 2, Mar. 1, 1989, Seiten 67–79, XP000197458.

* cited by examiner

*Primary Examiner*—Sandra M. Nolan
(74) *Attorney, Agent, or Firm*—George T. Marcou; Kilpatrick Stockton LLP

(57) ABSTRACT

Glass containers specifically for the storage of pharmaceutical or diagnostic solutions whose surface which comes into contact with the solutions is coated with a layer of oxides and/or nitrides of the elements Si, Ti, Ta, Al or mixtures thereof applied by means of a plasma CVD process.

1 Claim, 1 Drawing Sheet

CVD-COATED GLASS CONTAINER

BACKGROUND OF THE INVENTION

Glass containers for the storage of pharmaceutical or diagnostic solutions are intended to come into direct contact with such solutions. Different types of glass containers are used, such as ampuls, small bottles, injection bottles for prefabricated syringes, cylindrical ampuls and container for the taking of blood and blood samples.

It is known with respect to all glass container—seven glass containers made from borosilicate glass which are classified in the highest quality class in accordance with the pharmacopeias (such as the Deutsches Arzneibuch [German Pharmaceutical Book] DAB 10)—that interactions can be documented between the solutions and the glass surface. However, the interactions in the case of glass containers made from lime-natron glass are even substantially greater.

The interaction is based primarily on the leaching of alkalic substances from the glass surface through the aqueous solution. While the solution is being stored, this leaching can lead to an undesired increase in the pH-value (such as in the case of water for injection purposes) of several pH units (see B. Borchert et al., J. of Parenteral Science & Technology, Vol. 43, No. 2 March/April 1989).

With some medications, it is also possible for a portion of the active ingredient to be inactivated by ions dissolved from the glass, which is particularly disruptive in low dosed medications.

SUMMARY OF THE INVENTION

The task of the invention therefore consists of finding a glass container for the storage of pharmaceutical or diagnostic solutions which behaves in a largely inert manner vis a vis these solutions, i.e., a glass container in which the quantity of ions leached from the glass through the solutions is minimized.

This problem is solved by the glass container, specifically for the storage of pharmaceutical or diagnostic solutions, characterized by the fact, that the surface which comes into contact with the solutions is coated with a layer of oxides and/or nitrides of the elements Si, Ti, Ta, Al or mixtures thereof applied by means of a plasma CVD process.

DETAILED DESCRIPTION

Figure 1:
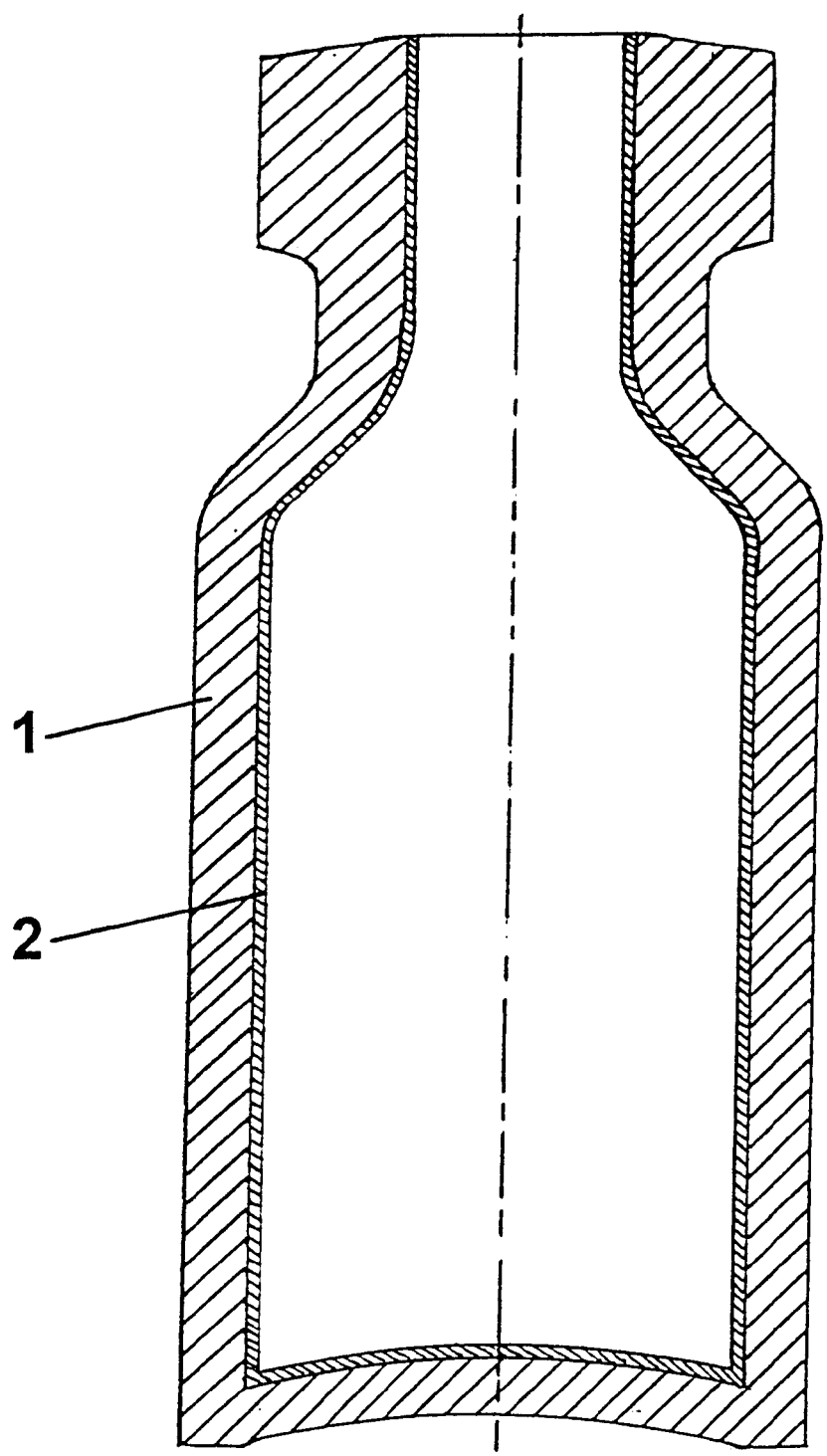
FIG. 1 is a sectional view of the container of the present invention.

The inner side of the glass container, i.e., the non-planar surface which is in contact with the solutions, is coated with a layer of oxides and/or nitrides of the elements Si, Ti, Ta, Al or mixtures thereof; said layer is created by means of a plasma CVD process (PCVD process). Specifically, the layer was manufactured by means of the plasma impulse CVD process (PICVD process).

In this process, a layer deposition from the gas phase (chemical vapor deposition=CVD) takes place, and the energy necessary for the cleavage of the precursor gases is brought into the system by means of an electric high frequency plasma. This process is well-known, in and of itself.

Surprisingly, it has been shown that a glass container with layers manufactured according to the PCVD or PICVD process possesses a very extraordinary resistance to leaching and thus behaves in a highly inert manner vis a vis the solutions stored therein.

Oxidic layers are particularly well suited, particularly those made from $SiO_2$ and $TiO_2$—with $SiO_2$ being preferred. The thickness of the layers should be about 10 to 1000 mn. A thickness of between 20 and 1000 mn, particularly 20 to 500 mn, is preferred. It is also possible to deposit multiple layers of varying composition to form a layer package; in this connection, it is intended that the layer package has the aforementioned layer thickness.

The composition of the glass from which the container is made is not critical. In general, the usual clear and colored glass for pharmaceutical applications will be used. Preferred, however, is glass which already belongs to a low hydrolytic class, i.e., particularly so-called neutral glass (borosilicate glass) (DAB 10).

By way of example, FIG. 1 shows a 10 ml injection glass bottle. The bottle consists of glass 1, whose inner side is provided with a SiO2 coat 2. The thickness of the $SiO_2$ coat is not presented according to scale.

The outstanding properties of the container in accordance with the invention are illustrated by the following example:

A glass container made from borosilicate grass composed of 75% $SiO_2$, 11% $B_2O_3$, 5% $Al_2O_3$, 7% $Na_2O$, 2% CaO+ BaO in the form of an injection bottle with 10 ml capacity, whose inner side has a 150 nm $SiO_2$ layer applied according to the PICVD process, is filled with 2 ml 0.4 mol HCI and then autoclaved for 1 hour at 121° C. Then the quantity of released sodium, calcium, aluminum, borosilicate and silicate cations is determined in $\mu g/l$. For comparison purposes, the test was repeated with an identical container which, however, was not provided with an inner coating. The results are summarized in the table.

| Cations release | Comparison Borosilicate glass without layer μg/l | Borosilicate glass with 150 nm $SiO_2$ layer (μg/l) |
|---|---|---|
| Sodium (Na) | 3.5 | < detection limit of 0.01 |
| Calcium (Ca) | 1.1 | < detection limit of 0.05 |
| Boron (B) | 3.5 | < detection limit of 0.10 |
| Aluminum (Al) | 2.3 | < detection limit of 0.05 |
| Silicone (Si) | 5.0 | < detection limit of 0.30 |

Each of the indicated values are average values from 32 tested glass containers. In the glass containers according to the invention, the quantity of leached cations always remains below the detection limit. Particularly surprising is the fact that, in spite of an $SiO_2$ concentration of 100% in the layer, the leached quantity of Si ions is distinctly lower than with the comparison sample, despite the fact that, in the latter, the SiO2 concentration in the wall which is in contact with the solution is only 75 percent by weight.

What is claimed is:

1. A glass container having a plasma impulse CVD deposited non-planar surface for the storage of pharmaceutical or diagnostic solutions, wherein the non-planar surface comes into contact with the solution and wherein said non-planar surface is coated with a layer consisting of SiO2 applied by means of a plasma impulse CVD process, wherein the layer is 20 to 1000 nm thick, and wherein the leachable quantity of Na-cation is less than 0.01 μg/l if a glass container having a 10 ml capacity is filled with 2 ml 0.4 molar HCl and then autoclaved for 1 hour at 121° C.

\* \* \* \* \*